United States Patent [19]

Blanchard

[11] Patent Number: 4,827,324

[45] Date of Patent: May 2, 1989

[54] IMPLANTATION OF IONS INTO AN INSULATING LAYER TO INCREASE PLANAR PN JUNCTION BREAKDOWN VOLTAGE

[75] Inventor: Richard A. Blanchard, Los Altos, Calif.

[73] Assignee: Siliconix incorporated, Santa Clara, Calif.

[21] Appl. No.: 927,882

[22] Filed: Nov. 6, 1986

[51] Int. Cl.[4] ............................................. H01L 29/34
[52] U.S. Cl. ......................................... 357/52; 357/63; 357/48; 357/50
[58] Field of Search ......................... 357/52, 63, 48, 50

[56] References Cited

U.S. PATENT DOCUMENTS 3,328,210  6/1967  McCaldin et al. ................... 148/1.5

FOREIGN PATENT DOCUMENTS 0075874  5/1984  European Pat. Off. .
2933455  3/1980  Fed. Rep. of Germany .
2028582  7/1979  United Kingdom .

OTHER PUBLICATIONS

Matsushita et al., "Highly Reliable High-Voltage Transistors by Use of The Sipos Process", IEEE Transactions on Electron Devices, vol. Ed-23, No. 8, Aug. 1976, pp. 826-830.
Baliga et al. "The Insulated Gate Transistor: A New Three-Terminal MOS-Controlled Biplar Power Device", IEEE Transactions on Electron Devices, vol. Ed-31, No. 6, Jun. 1984, pp. 821-828.
Gartner et al. "Electronic Conduction Mechanisms of Cs- and B-Implanted $SiO_2$-Films", Applied Physics 12, 1977, pp. 137-148.
Sandoe et al., "Characterization and Modelling of Sipos On Silicon High-Voltage Devices", IEE Proceedings, vol. 132, Pt. 1, No. 6, Dec. 1985, pp. 281-284.
Goetzberger, "Invited: Ion Implantation in Mos-Structures", 2419 Solid State Devices 5th Conference, 1973, pp. 289-294.

Primary Examiner—Robert S. Macon
Attorney, Agent, or Firm—Skjerven, Morrill, MacPherson, Franklin & Friel

[57] ABSTRACT

A method for forming a PN junction having an enhanced breakdown voltage includes the step of forming a silicon dioxide or other insulating layer over the PN junction of the diode. The silicon dioxide layer is then implanted with ions. Depending on the species implanted into the silicon dioxide layer, the silicon dioxide layer becomes resistive. The metallization contacting the anode of the diode and the cathode of the diode also contacts the doped silicon dioxide layer. Of importance, electrical fields caused by current flowing through the doped silicon dioxide layer alter the radius of curvature of the depletion region between the anode and cathode, thereby enhancing the diode breakdown voltage.

11 Claims, 1 Drawing Sheet

IMPLANTATION OF IONS INTO AN INSULATING LAYER TO INCREASE PLANAR PN JUNCTION BREAKDOWN VOLTAGE

BACKGROUND OF THE INVENTION

This invention relates to structures for increasing the breakdown voltage of PN junctions.

FIG. 1 illustrates a prior art diode 8 including a semi-insulating polycrystalline silicon (SIPOS) film 10 for enhancing the diode breakdown voltage. Diode 8 includes a P+ region 12 serving as the anode and an N substrate 14 serving as the cathode. An N+ region 16 facilitates electrical connection between substrate 14 and contact metallization 18, while P+ region 12 electrically contacts metallization 20. (Although illustrated as two separate structures, metallization 18 is typically a single structure joined outside the cross section of FIG. 1. Similarly, SIPOS film 10 is a single structure and N+ region 16 is a single region.) Of importance, SIPOS film 10 electrically contacts metallization 18 and 20 and extends over the PN junction of diode 8 between substrate 14 and P+ region 12.

As is known in the art, a SIPOS film comprises oxygen doped polycrystalline silicon and exhibits high ohmic resistance. See, for example, the article entitled "Highly Reliable High-Voltage Transistors by Use of the SIPOS Process," by Matsushita et al., published in IEEE Transactions on Electric Devices in August 1976, incorporated herein by reference.

As is known in the art, when a diode such as diode 8 is strongly reverse-biased, film 10 serves to increase the breakdown voltage of diode 8. The reason for this is that current through resistive film 10 generates an electric field which alters the shape of the depletion region 24 between P+ region 12 and N substrate 14. Specifically, this electric field increases the radius of curvature of depletion region 24, thereby enhancing the breakdown voltage of diode 8. Although SIPOS film 10 performs this function adequately, unfortunately, special equipment is required to form SIPOS films. This special equipment is typically expensive.

SUMMARY

A process for forming a diode in accordance with my invention includes the step of implanting ions into an insulating layer formed over the diode PN junction which increases the diode breakdown voltage. The process begins with the step of forming a first semiconductor region of a first conductivity type within a second semiconductor region of a second conductivity type, thereby forming a PN junction between the first and second semiconductor regions. An insulating layer is then formed over the first and second semiconductor regions. In one embodiment, the insulating layer comprises silicon dioxide.

The silicon dioxide layer is then doped with an ion such as cesium, for example, by ion implantation. Of importance, the presence of dopants in the silicon dioxide layer causes the silicon dioxide to become conductive (although still highly resistive). Further, by controlling the amount of the impurity introduced into the silicon dioxide layer, the resistance of the silicon dioxide layer can be controlled as desired.

Thereafter, portions of the silicon dioxide layer are selectively removed, thereby exposing portions of the first and second semiconductor regions. Contact metallization is then formed on the exposed portions of the first and second semiconductor regions.

As mentioned above, the resistivity of the insulating layer can be controlled. This permits adjustment of the diode breakdown voltage. In addition, the structure of the present invention can be formed without resorting to special expensive equipment.

The present invention can also be used to fabricate other devices having PN junctions with an enhanced breakdown voltage, e.g. SCR's, transistors, and IGT's.

DETAILED DESCRIPTION

Figure 1:
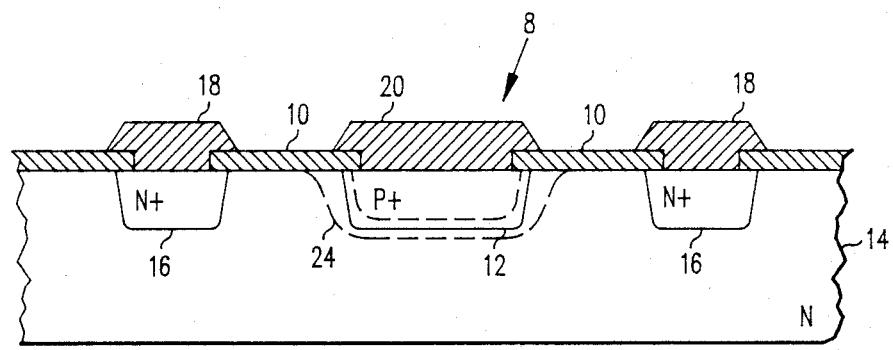
FIG. 1 illustrates in cross section a prior art diode including a SIPOS film.
Figure 2A:
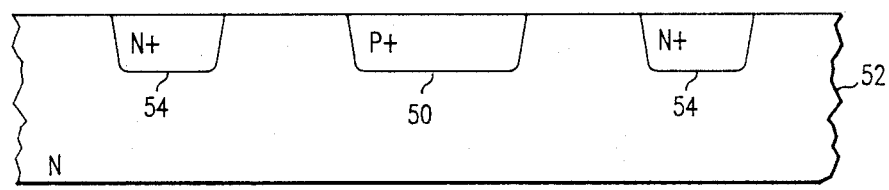
FIGS. 2a to 2c illustrate in cross section a diode including a doped silicon dioxide layer for enhancing diode breakdown voltage during a manufacturing process in accordance with the present invention.

Referring to FIG. 2a, a process in accordance with my invention begins by forming a P+ region 50 in an N type semiconductor substrate 52. In one embodiment, N type substrate 52 is N type silicon, although substrate 52 can be other semiconductor materials as well. P+ region 50 can be formed by any conventional technique, e.g. covering substrate 52 with a patterned photolithographic mask and implanting the exposed portions of substrate 52 with a selected P type impurity. In other embodiments, P+ region 50 is formed by diffusion of a selected impurity into substrate 52.

An N+ region 54 is then formed in substrate 52 as illustrated in FIG. 2a. Although illustrated as two separate regions, N+ region 54 is typically a single contiguous region joined outside the cross section of FIG. 2a, and facilitates electrical connection between substrate 52 and a subsequently formed metal contact. N+ region 54 can be formed by ion implantation or diffusion of a selected N type impurity into portions of substrate 52.

Figure 2B:
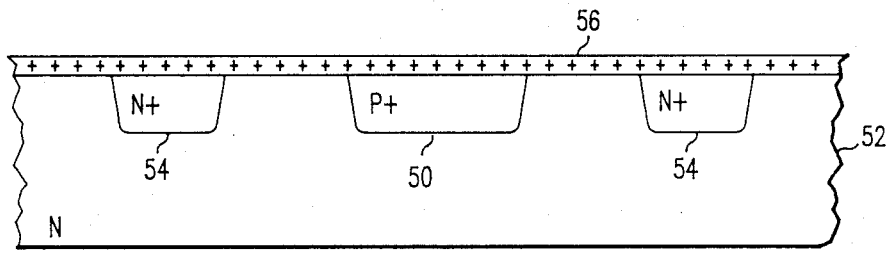

Referring to FIG. 2b, a silicon diode layer 56 is then formed on substrate 52. In one embodiment, silicon dioxide layer 56 is thermally grown to a thickness of about 10,000Å. In accordance with one novel feature of my invention, silicon dioxide layer 56 is then implanted with ions. In one embodiment, positive cesium ions are implanted having a dose between about $10^{13}$ and $10^{16}$ ions/cm$^2$, and an implant energy of about 50 to 200 Kev. Because of relatively low implant energy, the cesium ions come to rest within silicon dioxide layer 56. Because of the presence of cesium ions within silicon dioxide layer 56, instead of acting as an insulator, silicon dioxide region 56 becomes electrically resistive along the region where the cesium concentration is highest.

Thereafter, silicon dioxide layer 56 is covered with a photoresist layer (not shown), the photoresist layer is patterned in a conventional manner, thereby exposing portions of silicon dioxide layer 56, and the exposed portions of silicon dioxide layer 56 are removed. The photoresist layer is then removed and electrical contacts 58 and 60 are formed for electrically contacting regions 54 and 50, respectively. Although illustrated as two separate contacts, contact 58 is typically a single contact joined outside the cross-section of FIG. 2c. Contacts 56 and 58 are typically formed from sputtered or evaporated aluminum, or some other appropriate electrically conductive material.

Figure 2C:
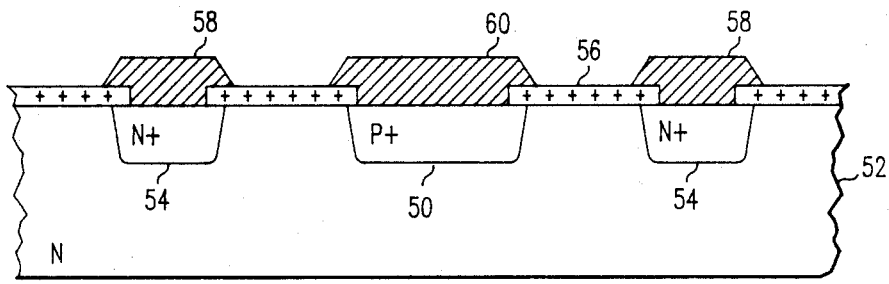

As illustrated in FIG. 2c, silicon dioxide layer 56 serves as a resistive electrical path between contacts 58 and 60. As mentioned above, the field created within silicon dioxide layer 56 serves to enhance breakdown voltage of the PN junction between P+region 50 and N type substrate 52 by changing the shape of the depletion region between region 50 and substrate 52. Specifically, the radius of curvature of the this depletion region is increased by an electrical field caused by current flowing through silicon dioxide layer 56.

Although FIG. 2c illustrates a P+region formed in an N type substrate, it will be appreciated in light of the teachings of this specification that the process of the present invention can also be used to form a diode including an N+region formed in a P type substrate. It will also be appreciated that ions other than cesium that increase the conductivity of silicon dioxide can be implanted into silicon dioxide layer 56. In addition, forming layer 56 from insulating materials other than silicon dioxide, e.g. silicon nitride, is also contemplated.

While the invention has been described in detail regarding specific embodiments, those skilled in the art will realize that changes can be made in form and detail without departing from the spirit and scope of the invention. For example, the process of the present invention can be used to enhance the breakdown voltage of devices including PN junctions other than diodes, e.g. transistors, SCR's and IGT's. (IGT's are discussed, for example, by Baliga et al. in the paper "The Insulating Gate Transistor: A New Three-Terminal Mos-Controlled Bipolar Device" published in IEEE Transactions on Electron Devices, Vol. ED-31, No. 6, June, 1984, page 821, incorporated herein by reference.) Accordingly, all such changes come within the present invention.

I claim:

1. A method for forming a PN junction comprising the steps of:
    providing a first semiconductor region of a first conductivity type;
    forming a second semiconductor region of a second conductivity type adjacent to said first semiconductor region, thereby forming a PN junction between said first and second semiconductor regions;
    forming an insulating layer over said PN junction;
    introducing an impurity into said insulating layer, thereby causing said insulating layer to become a resistive layer;
    providing a first structure for electrically contacting a first portion of said resistive layer over said first semiconductor region; and
    providing a second structure for electrically contacting a second portion of said resistive layer over said second semiconductor region, thereby enhancing the breakdown voltage of said PN junction.

2. The method of claim 1 wherein said step of introducing an impurity comprises the step of implanting ions into said insulating layer.

3. The method of claim 2 wherein the ion implanted into said insulating layer is cesium.

4. The method of claim 1 wherein said first and second semiconductor regions comprise silicon and said insulating material is silicon dioxide.

5. The method of claim 1 further comprising the steps of:
    forming an electrical contact for contacting said first semiconductor region; and
    forming an electrical contact for contacting said second semiconductor region, said resistive layer extending between said first and second electrical contacts.

6. The method of claim 1 wherein said second semiconductor region is formed within said first semiconductor region.

7. The method of claim 1 wherein said step of providing a first structure comprises the step of forming a first region of electrically conductive material electrically contacting said first semiconductor region and said first portion of said resistive layer, and wherein said step of providing a second structure comprises the step of forming a second region of electrically conductive material electrically contacting said second semiconductor region and said second portion of said resistive layer.

8. A structure comprising:
    a first semiconductor region of a first conductivity type;
    a second semiconductor region of a second conductivity type adjacent to said first semiconductor region so that a PN junction forms between said first and second semiconductor regions;
    a resistive layer of material formed over said PN junction between said first and second semiconductor regions, said layer of material being doped with ions, said layer of material being of a type such that said layer of material would be insulating if not implanted with ions;
    a first structure electrically contacting a first portion of said resistive layer over said first semiconductor region; and
    a second structure electrically contacting a second portion of said resistive layer over said second semiconductor region, said resistive layer of material enhancing the breakdown voltage of said PN junction.

9. The structure of claim 8 wherein said material comprises silicon dioxide.

10. The structure of claim 8 wherein said layer of material is doped with cesium.

11. Structure of claim 8 wherein said first structure comprises electrically conductive material contacting said first semiconductor region and said first portion of said resistive layer of material, and wherein said second structure comprises electrically conductive material electrically contacting said second semiconductor region and said second portion of said resistive layer of material.

* * * * *

UNITED STATES PATENT AND TRADEMARK OFFICE
CERTIFICATE OF CORRECTION

PATENT NO.    : 4,827,324

DATED         : May 2, 1989

INVENTOR(S)   : Richard A. Blanchard

It is certified that error appears in the above-identified patent and that said Letters Patent is hereby corrected as shown below:

Col. 2, line 64, "56 and 58" should read --58 and 60--.

Signed and Sealed this

Second Day of June, 1992

Attest:

DOUGLAS B. COMER

*Attesting Officer*    *Acting Commissioner of Patents and Trademarks*